(12) United States Patent     (10) Patent No.: US 7,733,479 B2
Shew et al.                      (45) Date of Patent:   Jun. 8, 2010

(54) CHARGED CARBON NANOTUBES FOR USE AS SENSORS

(76) Inventors: Chwen-Yang Shew, 147-43 Delaware Ave., Flushing, NY (US) 11355;
Godfrey Gumbs, 182-11 Henley Rd., Jamaica Estates, NY (US) 11432;
Takafumi Iwaki, 1-9-1 Kyoyama, Okayama-shi, Okayama 700-0015 (JP)

( * ) Notice: Subject to any disclaimer, the term of this patent is extended or adjusted under 35 U.S.C. 154(b) by 798 days.

(21) Appl. No.: 11/443,341

(22) Filed: May 31, 2006

(65) Prior Publication Data
US 2007/0116628 A1    May 24, 2007

Related U.S. Application Data

(60) Provisional application No. 60/685,770, filed on Jun. 1, 2005.

(51) Int. Cl.
*G01N 21/01* (2006.01)
(52) U.S. Cl. ..................................... 356/244
(58) Field of Classification Search .......... 356/244–246
See application file for complete search history.

(56) References Cited
U.S. PATENT DOCUMENTS
2008/0274912 A1* 11/2008 Johnson et al. ............... 506/13

OTHER PUBLICATIONS

Paloniemi et al. "Water-Soluble Full-Length Single-Wall Carbon Nanotube Polyelectrolytes: Preparation and Characterization", Apr. 5, 2005, Physical Chemistry, pp. 8634-8642.*
Iwaki et al. "The effect of salt concentration on the optical modes of charged cylindrical nanotubes", Jun. 21, 2005, Journal of Applied Physics, vol. 97, pp. 124307 1-5.*

* cited by examiner

*Primary Examiner*—Kara E Geisel
(74) *Attorney, Agent, or Firm*—Isaac A. Angres

(57) ABSTRACT

The invention relates to charged single-wall carbon nanotubes and their use in sensing and monitoring devices. The charged single-wall carbon nanotubes, have been found to have spectral shifts in certain regions of the electromagnetic spectrum. The charged single wall nanotubes are very sensitive to environmental perturbations and the nanotube's optical properties will be affected by these perturbations. Accordingly, the charged single wall carbon nanotubes can be used as sensors for a wide variety of applications, such as salt concentrations and pH, signal generators, measuring length of DNA molecules, as well as optical tags for biological detection and mapping of malignant cell activity. Optimal sensor devices are achieved in the present invention when the charged single-wall carbon nanotube carries a linear charge density close to that of DNA. The invention further describes an optical pH sensor comprising at least one charged carbon nanotube in solution.

44 Claims, 3 Drawing Sheets

CHARGED CARBON NANOTUBES FOR USE AS SENSORS

This application claims the priority benefit under 35 U.S.C. section 119 of U.S. Provisional Patent Application No. 60/685,770 entitled "Use of Charged Carbon Nanotubes as an Optical Probe of Salt Concentration in Solutions and Related Sensors" filed Jun. 1, 2005, which is in its entirety herein incorporated by reference.

FEDERALLY SPONSORED RESEARCH OR DEVELOPMENT

This invention was partially sponsored by the National Science Foundation Grant No. PHY99-07949 and the National Institutes of Health Grant No. 4137308-04. This invention was made with government support. The government has certain rights in the present invention.

FIELD OF INVENTION

This invention relates generally to charged single-wall carbon nanotubes, and more particularly to new materials and devices formed from these charged single-wall carbon nanotubes, and to methods for using these charged single-wall carbon nanotubes, such as for chemical and biological sensors. The present invention further relates to charged carbon nanotubes, and in particular to formation of sensors utilizing charged carbon nanotubes. The invention is also directed to charged single-wall carbon nanotubes, and to methods for using these charged single-wall carbon nanotubes, such as for optical chemical sensors. The present invention also relates to charged single wall carbon nanotubes and a method of detecting a chemical compound using same.

The invention also is directed to carbon nanotubes as detectors of salt concentration in solution. Additionally, the invention provides novel nanoscaled pH sensors with an array of charged nanotubes can be used for weak acid or weak base groups. This invention also relates to an optical sensor for measuring pH with improved stability and sensitivity. The invention further relates to sensors for probing cellular systems to distinguish a normal cell from a cancerous cell with different pH values near the cellular surface in vivo.

The instant invention is also directed to nanotubes in solution which may be employed as a signal generator and also for biological characterization such as for determining the length of a DNA molecule.

BACKGROUND OF THE INVENTION

Carbon nanotubes are intriguing structures that have sparked much excitement in recent years and a large amount of research has been dedicated to their understanding.

Carbon nanotubes are unique cylindrical carbon-based, seamless tubes of graphite sheets having molecular structures that exhibit interesting and novel properties that make them potentially useful in a wide variety of applications (e.g., nanoelectronics, optics, materials applications, etc.). They exhibit extraordinary strength and unique electrical properties, and are efficient conductors of heat. Two general types of carbon nanotubes are referred to as multi-wall carbon nanotubes (MWCNTs) and single-wall carbon nanotubes (SWCNTs). SWCNTs have a cylindrical sheet-like, one-atom-thick shell of hexagonally-arranged carbon atoms, and MWCNTs are typically composed of multiple coaxial cylinders of ever-increasing diameter about a common axis. Thus, SWCNTs can be considered to be the structure underlying MWCNTs and also carbon nanotube ropes, which are uniquely-arranged arrays of SWCNTs. Single-Wall Carbon Nanotubes (SWCNTs) have shown promising sensing properties in terms of sensitivity.

The above carbon nanotubes which are also known as buckytubes are members of the fullerene structural family, which also includes buckyballs. Buckyballs are spherical in shape, while a nanotube is cylindrical, with at least one end typically capped with a hemisphere of the buckyball structure. Their name is derived from their size, since the diameter of a nanotube is on the order of a few nanometers (approximately 50,000 times smaller than the width of a human hair), while they can be up to several centimeters in length.

Single-wall carbon nanotubes (SWCNTs), have unique and very attractive physical properties, such as high strength, stiffness, thermal and electrical conductivity. SWCNTs are hollow, tubular fullerene molecules consisting essentially of $sp^2$-hybridized carbon atoms similar to graphite and typically arranged in hexagons and pentagons. The $sp^2$ bonding structure is stronger than the $sp^3$ bonds found in diamond therefore providing the molecules with their unique strength. Nanotubes naturally align themselves into "ropes" held together by Van der Waals forces. Under high pressure, nanotubes can merge together, trading some $sp^2$ bonds for $sp^3$ bonds, giving great possibility for producing strong, unlimited-length wires through high-pressure nanotube linking. Single-wall carbon nanotubes typically have diameters in the range of about 0.5 nanometers (nm) and about 3.5 nm, and lengths usually greater than about 50 nm. Useful information on single-wall carbon nanotubes can be found in B. I. Yakobson and R. E. Smalley, American Scientist, Vol. 85, July-August, 1997, pp. 324-337.

In 1991, Sumio Iijima, a researcher with the NEC Laboratory in Tsukuba, Japan, observed that carbon fibers produced with a carbon arc were hollow. This feature of nanotubes is of great interest to physicists because it permits experiments in one-dimensional quantum physics.

The diameter of most SWCNTs is a few nanometers, with a tube length that can be many thousands of times larger. The structure of a SWCNT can be conceptualized by wrapping a one-atom-thick layer of graphite (called graphene) into a seamless cylinder. The way the graphene sheet is wrapped is represented by a pair of indices (n,m) called the chiral vector. The integers n and m denote the number of unit vectors along two directions in the honeycomb crystal lattice of graphene. If m=0, the nanotubes are called "zigzag". If n=m, the nanotubes are called "armchair". Otherwise, they are called "chiral".

A very important variety of carbon nanotube is a SWCNT because they exhibit important electric properties that are not shared by the multi-wall carbon nanotube (MWCNT) variants. SWCNTs are the most likely candidate for miniaturizing electronics past the microelectromechanical scale that is currently the basis of modern electronics. The most basic building block of these systems is the electric wire, and SWCNTs can be excellent conductors. One useful application of SWCNTs is in the development of the intramolecular field effect transistors (FETs).

The synthesis of fullerenes is typically accomplished by the condensation of vaporized carbon at high temperature. Fullerenes, such as $C_{60}$ and $C_{70}$, may be made by carbon arc methods using vaporized carbon at high temperature. Carbon nanotubes have also been produced as one of the deposits on the cathode in carbon arc processes.

Single-wall carbon nanotubes have been produced in very low yields in a DC arc discharge apparatus by simultaneously evaporating carbon and a small percentage of Group VIIb transition metal from the anode of an arc discharge apparatus. The above technique produces a population of carbon nanotubes which exhibits significant variations in structure and size.

An alternative method to synthesize carbon nanotubes is by catalytic decomposition of a carbon-containing gas by nanometer-scale metal particles supported on a substrate. The carbon feedstock molecules dissociate on the metal particle surface and the resulting carbon atoms combine to form nanotubes. The method typically produces imperfect multi-wall carbon nanotubes, but under certain reaction conditions, can produce excellent single-wall carbon nanotubes. One example of this method involves the disproportionation of CO to form single-wall carbon nanotubes and $CO_2$ catalyzed by transition metal catalyst particles comprising Mo, Fe, Ni, Co, or mixtures thereof residing on a support, such as alumina. The method often results in tangled carbon nanotubes and also requires the removal of the support material for many applications.

Another way of producing single-wall carbon nanotubes involves laser vaporization of a graphite substrate doped with transition metal atoms (such as nickel, cobalt, or a mixture thereof) to produce single-wall carbon nanotubes. The single-wall carbon nanotubes produced by this method tend to be formed in clusters, termed "ropes," of about 10 to about 1000 single-wall carbon nanotubes in parallel alignment, held by van der Waals forces in a closely packed triangular lattice. Nanotubes produced by this method vary in structure, although certain structures may predominate. The laser vaporization process can produce improved yields of single-wall carbon nanotubes, however the resulting product is still heterogeneous, and the nanotubes tend to be too tangled for many potential uses of these materials. In addition, the laser vaporization of carbon is a high energy process.

The known methods of synthesizing single-carbon nanotubes also produce a distribution of reaction products, including, but not limited to, single-wall carbon nanotubes, amorphous carbon, metallic catalyst residues, and, in some cases, multi-wall carbon nanotubes. The distribution of reaction products will vary depending on the process and the operating conditions used in the process. In addition to the distribution of reaction products, the process type and operating conditions will also produce single-wall carbon nanotubes having a particular distribution of diameters and conformations.

The electronic properties of single-wall carbon nanotubes are very dependent on the conformation. For example, armchair tubes are metallic and have extremely high electrical conductivity. All single-wall carbon nanotubes can be categorized as metallic, semi-metals, or semiconducting depending on their conformation. In the present specification, both metallic tubes and semi-metal tubes will be referred to collectively as metallic nanotubes. For single-wall carbon nanotubes, about one-third of the tubes are metallic and about two-thirds are semiconducting. Metallic (n, m)-type nanotubes are those that satisfy the condition: $2n+m=3q$, or $n-m=3q$ where "q" is an integer. Metallic nanotubes are conducting with a zero band gap in energy states. Nanotubes not satisfying either condition are semiconducting and have an energy band gap. Generally, semiconducting nanotubes with smaller diameters have larger energy band gaps. Regardless of tube type, all single-wall nanotubes have extremely high thermal conductivity and tensile strength.

The properties of a collection of a particular (n, m) selected carbon nanotube will differ from those of a mixture of single-wall carbon nanotubes that are made by the different production processes. The properties of mixtures of nanotube types represent a composite value over a distribution of property values. This composite value is generally not "average" behavior. In fact, the properties of composites can not only be inferior to, but also lacking altogether in a mixture of single-wall carbon nanotubes compared to those of a particular selected (n, m) type nanotube. Additionally, in the diameter range of single-wall carbon nanotubes, generally about 0.5 nm to about 3.5 nm, the alignment of the nanotubes to each other in closely-packed arrays, such as the well-known single-wall carbon nanotube "ropes", can be optimized when all the nanotubes are of the same diameter, minimizing misfits between tubes of different diameter.

No effective process for making single-wall carbon nanotubes is known whereby significant quantities of carbon nanotubes made are of a single (n, m) type. Furthermore, to date, no methods for separating quantities of single-wall carbon nanotubes by (n, m) type are known, and no macroscopic quantity of such single (n, m) type single-wall carbon nanotube material has been produced. Macroscopic amounts of type-sorted single-wall carbon nanotubes that would provide the broadest range of possible nanotube properties and applications are heretofore unknown.

The particular nanotube diameter and conformation affects the physical and electronic properties of the single-wall carbon nanotube. For example, the stiffness, strength, density, electrical conductivity, magnetic properties, crystallinity, thermal conductivity, absorption, response to doping, utility as semiconductors, optical properties such as absorption and luminescence, utility as emitters and detectors, energy transfer, heat conduction, reaction to changes in pH, buffering capacity, sensitivity to a range of chemicals, contraction and expansion by electrical charge or chemical interaction, nanoporous filtration membranes and many more properties are affected by the diameter and conformation of the single-wall carbon nanotube.

Little work has been done on the unique chemical properties of carbon nanotubes in solution, particularly, in aqueous solutions. As an extended conjugated double-bond system with high surface area, carbon nanotubes are expected to stabilize and accumulate charges far better than small molecules. The accumulated charges on a carbon nanotube can be potentially used for many applications including reactions that are hard to carry out using small molecules.

Industry, academia, experimentalist and theoreticians have given a great deal of attention in trying to understand the electronic transport and optical properties of carbon nanotubes. For example, the plasmon excitation properties have been studied for singlewall and multiwall nanotubes as well as a linear array of nanotubes. Plasmon excitations display many new features in the presence of an applied magnetic field, such as many cusps in the plasmon spectrum as a function of the magnetic flux through the tubule. The flux-dependent plasmon frequency has been shown to be proportional to the induced persistent-current density in the tubule.

Despite their unique properties, the low solubility of carbon nanotubes in aqueous solution has impeded further development of useful applications in biologically related systems. The common approach to enhance their solubility in aqueous solution is to either physically or chemically incorporate charged groups into a carbon nanotube. Sonication has been a widely used physical method. Recently, Chiang et al. (*J. Phys. Chem.* B 105, 8297 (2001)) have reported a procedure to prepare protonated single-wall carbon nanotubes through sonication of carbon nanotubes in acidic solution. It is believed that the hydronium ions strongly intercalate into the ropes of carbon nanotubes, which cannot be removed by simple vacuum drying. Protonated single-wall carbonnanotubes may be considered as charged nanotubes.

In addition to positively charged nanotubes, negatively charged nanotubes have been obtained by sonication of the mixture of double stranded DNA and nanotubes in aqueous solution. Nakashima et al. (*Chem. Lett.* 32, 456 (2003)) have shown that DNA and nanotube complexes are water soluble. Meanwhile, the negative charge sign of DNA-nanotube complexes has been confirmed by Zheng et al. (*Science* 302, 1545 (2003)). In other words, both positively and negatively charged carbon nanotubes can be synthesized.

An alternative to add charges onto a carbon nanotube may be achieved by surface modification. Water-soluble SWCNTs have been obtained by surface modifications such as functionalization with carboxylate groups and surface coatings with surfactants or single stranded DNA. As a matter of fact, there has been great interest in using single-wall carbon nanotubes (SWCNTs) as nanoscale probes and sensors in biological electronics and optical devices because the electronic and optical properties of SWCNTs are extremely sensitive to the surrounding environmental changes. To date, most research on SWCNTs has focused on electronic devices, with relatively little work on optical biosensors.

SWCNTs possess unique optical properties as a result of their one-dimensional nature. Sharp peaks in the density of states, called van Hove singularities, arise from a quantization of the electronic wave vector in the 1-D system. As a result of these singularities, SWCNTs possess peaks in their optical spectra that correspond to interband transitions from the valence band to the conduction band. In addition, the transitions are found to be grouped in spectral space according to nanotube type (metallic vs. semiconducting) and band index, which are responsible for the observed sharp and pronounced optical absorption peaks in individual SWCNTs.

The abovementioned water-soluble SWCNTs, obtained by surface modifications, have displayed undisrupted characteristic optical absorption features. It has been observed that the optical characteristics of surface modified SWNTs are pH sensitive, which suggests new opportunities for SWCNTs based optical biosensor applications yet to be explored. Nanotubes may even be combined with recently developed nanolasers, nano waveguides and nano optical fibers, to make optical nanosensors in the near future.

Additionally, the probing, characterization, and manipulating of single polymers like DNA has been accomplished with the aid of optical methods, e.g., observing evanescent field fluorescence of dye molecules, deflecting light beams in atomic force microscopes, or trapping attached dielectric objects with optical tweezers. Also, there has been some progress at the molecular level in the study of the electrical ionic conduction signals from voltage biased nanoscale biopores. Recently, a voltage bias on an alpha hemolysin biopore has been shown to induce charged single-stranded DNA and RNA molecules to translocate through the pore. Each translocating molecule blocks the open pore ionic current providing an electrical signal that depends on several characteristics of the molecule. The system has limits for studies of biological molecules: the pore is of a fixed size, and its stability and noise characteristics are restricted by chemical, mechanical, electrical, and thermal constraints.

Therefore, a long felt need exists in the art to address the aforementioned deficiencies and inadequacies. The prior art is silent on the use of charged carbon nanotubes for applications such as optical pH sensors, biosensors and many other applications. Also, there is a need for new methods for studying polymer molecules such as DNA.

OBJECTS OF THE INVENTION

It is a first object of the present invention to provide a method to detect very low levels of salt concentrations using charged nanotubes.

It is a further object of the instant invention to provide a method to detect small changes in the pH of a solution using charged carbon nanotubes.

It is another object of the invention to provide a method to probe cellular systems in vitro and in vivo for salt concentration and pH sensor measurements.

It is still an object of the present invention to provide a method to detect cell abnormalities (e.g. cancer) through the above measurements.

It is an additional object of this invention to provide a method to produce a salt induced or pH induced signal generator.

A still additional object of this invention to provide a method for the use of DNA carbon nanotubes complexes carbon to characterize the length of the DNA or for use on these complexes in other measurements.

Another important object of the invention is to provide single-wall charged carbon nanotubes having a linear charge density close to that of DNA.

These and other objects of the present invention will more readily become apparent from the description and examples which follow.

SUMMARY OF THE INVENTION

Figure 1:
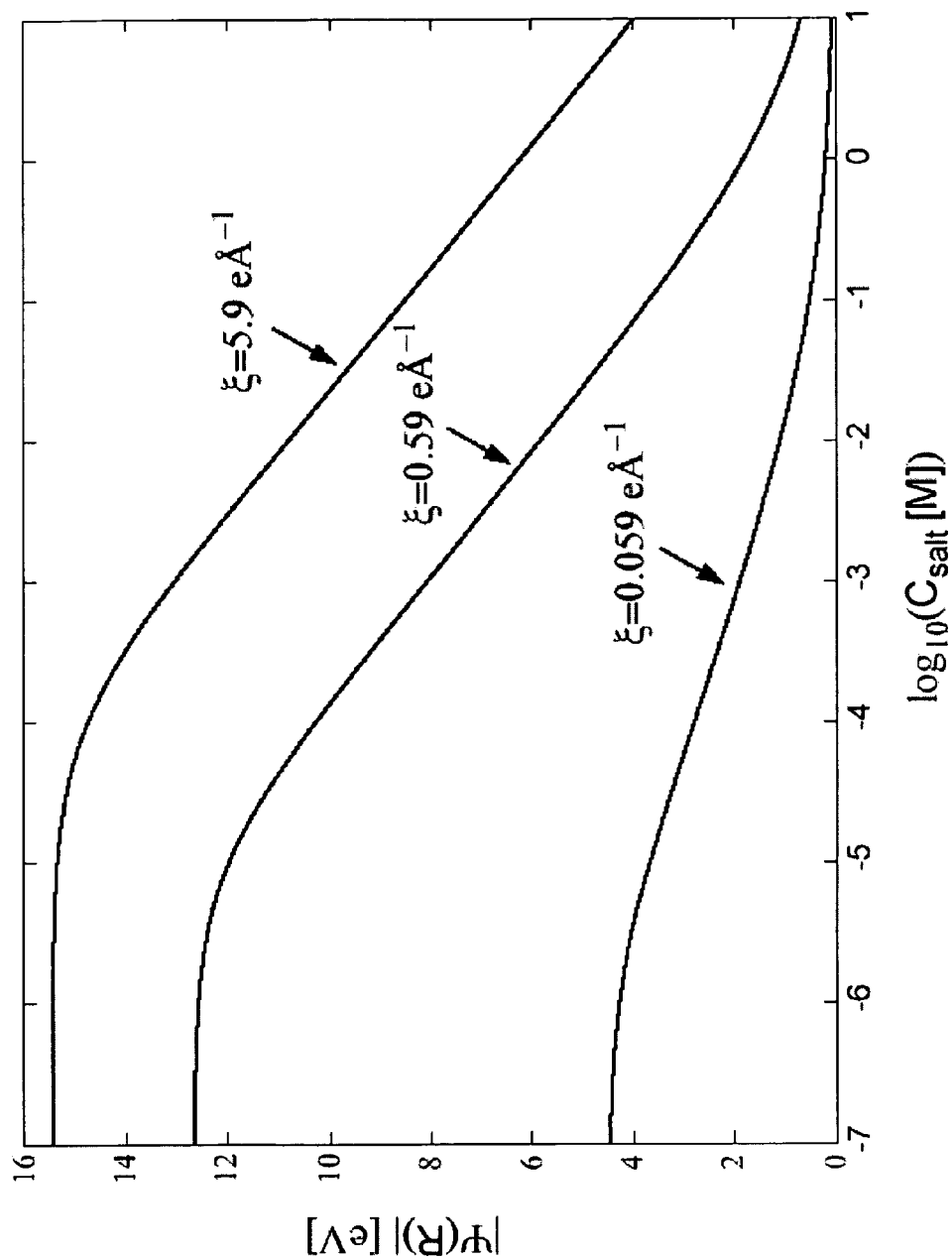
FIG. 1 shows the surface potential as a function of the excess salt concentration for different linear charge densities.

The present invention provides a detector and a method for determining salt concentration in solution using the optical response properties of charged single wall carbon nanotubes.

The instant invention also provides a pH sensor comprising an array of charged carbon nanotubes which sensor can be used for determining the pH of weak acid or weak base groups. The shift of the optical modes can be utilized to probe the solution pH. Under different pH values, the linear charge density of the charged nanotube is varied.

Furthermore, the present invention provides a probe and a method for studying cellular systems by the use of the nanoscaled salt concentration sensors and pH sensors based on charged single wall carbon nanotubes. The probes may be used to distinguish a normal cell from a cancerous cell with different pH values and salt concentrations near the cellular surface in vivo.

The invention also provides salt-induced and pH-induced signal generators wherein the shift in the acoustic plasmon frequency of a charged single wall carbon nanotube in a solution may be employed as a signal generator as a result of different salt concentrations and pH values.

Additionally, the invention is also particularly useful in biological characterization. Since DNA molecules form a complex with the single wall carbon nanotubes, one can determine the length of a DNA molecule by measuring the acoustic plasmon frequency which is determined by the net charge, arising from a charged DNA molecule, on a carbon nanotube.

The instant invention also provides the opportunity to optimize the performance of the sensor devices based on single wall charged carbon nanotubes having a linear charge density close to that of DNA.

The invention further provides single wall charged carbon nanotubes having a linear charge density approximately equal to $\xi/e=0.59$ Å$^{-1}$.

The invention provides an optical sensor comprising a charged single-wall carbon nanotube, wherein the charged single-wall carbon nanotube changes optical properties at an intensity or a spectral shift related to a charge in environment and wherein said intensity is derived from a spectral shift and wherein said charged single-wall nanotube has a linear charge density $\xi/e$ that is close to that of DNA.

The invention is directed to a biosensor responsive to a chemical property in an environment, comprising: (a) one or more single charged carbon nanotubes forming an array and showing a dependence of the chemical property, wherein at least one or more of the single-wall carbon nanotubes has a linear charge density close to that of DNA; and (b) a processor coupled to one or more of the single wall charged carbon nanotubes for processing the response of the plurality of single wall carbon nanotubes to the chemical property.

The instant invention provides an optical pH sensor comprising at least one charged single-wall carbon nanotube in solution wherein said charged single-wall nanotube has a linear charge density $\xi/e$ that is close to that of DNA.

Additionally, the invention provides an optical sensor comprising: (a) a charged single wall carbon nanotube of finite length having an electrical contact pad at each end thereof; and (b) a plurality of self-assembled molecules on a surface of said carbon nanotube, said molecules serving to modulate electrical conductivity of said carbon nanotube by either a reversible change in dipole moment of said molecules or by a reversible molecule-assisted electron/energy transfer from said molecules onto said carbon nanotube and wherein said charged single-wall nanotube has a linear charge density $\xi/e$ that is close to that of DNA.

The invention is further directed to method for measuring the length of a DNA molecule, which method comprises: (a) forming a complex between said DNA molecule and a neutral single-wall carbon nanotube or a complex between said DNA molecule and an oppositely charged single-wall carbon nanotube; (b) determining the line charge density of said complex; and (c) measuring the acoustic plasmon frequency of said complex.

The invention is also directed to a method for measuring an interaction at an interface between a charged single wall carbon nanotube probe and a target, said method comprising measuring an effect of said interaction between said probe and said target at said interface using a surface-selective linear or nonlinear optical technique and wherein said charged single-wall nanotube has a linear charge density $\xi/e$ that is close to that of DNA.

The instant invention also provides a method for measuring an interaction at an interface between an attached probe consisting of a single-wall charged carbon nanotube and a biological component in a cell, said method comprising measuring changes in the electronic properties leading to changes in the nonlinear properties of said nanotube, wherein said changes in said nonlinear properties of said nanotube are detected using a surface-selective linear or nonlinear optical technique and wherein said charged single-wall nanotube has a linear charge density $\xi/e$ that is close to that of DNA.

The instant invention also provides a method for optically sensing chemical species, said method comprising: (a) illuminating individually-dispersed single-wall charged carbon nanotubes with an electromagnetic radiation capable of causing the nanotubes to emit luminescence; (b) monitoring the excitation or luminescence of the single-wall charged carbon nanotubes; (c) exposing the single-wall charged carbon nanotubes to chemical species that affect the collective excitation or luminescence; and (d) correlating changes in the collective excitation or luminescence from exposure of the single-wall charged carbon nanotubes to the chemical species and wherein said single-wall charged carbon nanotubes have a linear charge density $\xi/e$ that is close to that of DNA.

The invention also provides single-wall charged carbon nanotubes that have spectral properties that are highly sensitive to their molecular environment. In particular, single-wall charged carbon nanotubes have been found to illuminate in the near-infrared portion of the electromagnetic spectrum. Chemical adsorbates on the nanotubes can affect, alter and modulate their spectral properties. The nanotubes are also sensitive to general conditions of the fluid environment, such as pH, temperature, pressure and flow. The nanotubes can sense these conditions as part of non-invasive optical probes, and are suitable for use in a nanoscale environment, including, but not limited to, living biological systems. The dynamic sensing capabilities of selected types of the above type of nanotubes provide for a wide variety of sensing and monitoring applications.

The invention provides a stable charge storage device comprising at least one charged carbon nanotube in solution. Particularly provided is a stable charge storage device where the charged carbon nanotube is in the form of dispersed nanotubes.

The invention is further directed to an optical sensor for sensing a physical quantity in a chemical or biological environment, said optical sensor comprising: a charged single-wall carbon nanotube material having an optical characteristic which depends on light wavelength; a housing having first and second optical elements for defining a cavity in which the charged single-wall carbon nanotube material is disposed, for transmitting light to the charged single-wall carbon nanotube material, and for transmitting light which has been made incident on the charged single-wall carbon nanotube material; and a controlling element for controlling the charged single wall carbon nanotube material in accordance with the physical quantity to cause a change to an optical characteristic of the charged single-wall carbon nanotube material which depends on light wavelength and wherein said charged single-wall carbon nanotube a linear charge density close to that of DNA.

In another aspect, the invention also provides a detector comprising a charged single-wall carbon nanotubes wherein at least one charged single-wall carbon nanotube emits near-infrared fluorescence and wherein said charged single-wall carbon nanotube has a linear charge density close to that of DNA.

In one additional embodiment of the invention, single-wall carbon nanotubes with charged groups incorporated are dispersed in a liquid such as water, such that the resulting nanotubes have a net charge.

In a further embodiment, single-wall carbon nanotubes are dispersed in a liquid, wherein the pH of the liquid is adjusted so as to cause the single-wall carbon nanotubes to carry a net electric charge. The charge carried by each nanotube depends on its individual structure and chirality.

DESCRIPTION OF THE PREFERRED EMBODIMENTS

As defined further herein, the terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. It will be further appreciated that the same thing can be said in more than one way. Consequently, alternative language and synonyms may be used for any one or more of the terms discussed herein, nor is any special significance to be placed upon whether or not a term is elaborated or discussed herein. A recital of one or more synonyms does not exclude the use of other synonyms.

Additionally, as used in the present specification, "at least", "around", "about" or "approximately" shall generally mean within 20 percent, preferably within 10 percent, and more preferably within 5 percent of a given value or range. Numerical quantities given herein are approximate, meaning that the term "at least" "around", "about" or "approximately" can be inferred if not expressly stated.

The instant invention had its birth as a result of Applicants' theoretical calculations which were carried out for the collective plasmon excitations of conduction electrons confined to the surface of a charged single-wall cylindrical nanotube in salt solutions. The inventors of the instant subject matter looked at both positively and negatively charged carbon nanotubes and found that at high salt concentration, the surface potential is small, and consequently the plasmon spectrum is almost the same as that of a neutral nanotube. Applicants' also found that when a nanotube is negative or positively charged, the highest frequency branch of the intra-subband plasmon excitations experiences a red or a blue shift, respectively. The result can be attributed to the change in the density of states near the Fermi energy. As salt concentration is increased, the surface potential is screened out, and the spectral line shift diminishes. The results also show that the negatively charged nanotube can be more sensitive to the ambient salt concentration than the positively charged one. Finally, the inventors discovered that the optimal sensor device occurs when the single-wall carbon nanotube carries a linear charge density close to that of DNA.

The calculations carried out by the inventors demonstrate new opportunities for charged carbon nanotube optical sensors that operate in strongly absorbing media of relevance to medicine or biology. For example, the inventors have found that in the presence of excess salt, the surface potential of a single-wall nanotube may be modified, which therefore influence the electronic properties or spectral properties of the nanotube. Applicants' probed the salt concentration of a solution through the spectral line shift of the optical excitation spectrum of a carbon nanotube leading them to conclude that charged single wall carbon nanotubes have numerous applications in the field of biology and chemistry as optical sensors.

In Applicants' rigorous calculations, they first calculated the single-particle energy eigenstates for the quasifree electrons in the presence of the applied potential (modified surface potential) induced by charged species in solution. The energy eigenvalues were analyzed as functions of salt concentration by solving the Schrödinger equation in the applied potential. The inventors' introduced the Coulomb interaction between electrons and determined the charge-density fluctuations due to a weak external potential. They also used random phase approximation to obtain the plasmon dispersion equation for plasmons under the applied potential. This leads to the behavior of plasmon excitation spectrum of positively and negatively charged carbon nanotubes in salt solution.

According to the invention, the charged carbon nanotubes in a salt solution are believed to be best represented by a cell model which consists of two cylinders. The inner cylinder is infinitely long, and its radius is chosen to be R, equal to the radius of the polyion in solution. The surface charge density is $\sigma e$, where e is the electron charge. The linear charge density of a charged polymer is equal to $\xi/e(=2\pi R\sigma)$. For DNA, $\xi/e=0.59$ Å$^{-1}$. The charged cylinder is confined by an outer cylindrical cell of radius $r_b$ greater than the inner charged cylinder. The radius of the cylindrical cell is chosen to reflect the concentration of excess salt and polyion concentration. This is the so-called zero-th order approximation that considers the mean volume taken by each nanotube in solution but which neglects the interactions between charged nanotubes. The concentration of charged polymer molecules is characterized by their average charge over the whole solution, $n_f$. In the cell model, it corresponds to the outer boundary radius as $r_b = \sqrt{2R\sigma/n_f}$. Finally, there are counterions and co-ions whose concentrations are $n_f + n_0$ and $n_0$, respectively, where $n_0 = C_{salt}$ is the concentration of added salt. The Poisson-Boltzmann equation for this system takes the following form:

$$\frac{1}{r}\frac{d}{dr}\left[r\epsilon(r)\frac{d\psi}{dr}\right] = \rho(r), \tag{1}$$

where $\epsilon(r)$ is the dielectric constant [$\epsilon(r)=\epsilon_<$ for $r>R$ in aqueous solution and $\epsilon(r)=\epsilon_<$ for $r\leq R$ to account for the dielectric constant inside of the nanotube], and $$\rho(r) = e\sigma\delta(r-R) + f(r)H(r-R) \tag{2}$$

$$f(r) = e\sum_i z_i n_i \exp(z_i e\psi/k_B T), \tag{3}$$

where H(r−R) is the Heaviside step function. Note that the ionic species denoted by index i have valence $z_i$ and number density $n_i$.

The boundary conditions near the surface are given by $$\lim_{r\to R}^{+0} \frac{d\Psi}{dr} = \frac{e\sigma}{\epsilon_>}, \tag{4}$$

$$\lim_{r\to R}^{-0} \frac{d\Psi}{dr} = 0. \tag{5}$$

Due to the continuity of potential, the potential near the surface of the nanotube (r→R) should satisfy the following condition:

$$\lim_{r\to R}{}^{+0}\psi(r) = \lim_{r\to R}{}^{-0}\psi(r) \tag{6}$$

Namely, the surface potential $\psi(R)$ can be directly calculated from outside the nanotube by using the ambient dielectric constant $\epsilon_<$. To this end, Eq. (1) is transformed into the following scaled equation:

$$\frac{d^2y}{dr^2} + \frac{1}{r}\frac{dy}{dr} = -\kappa^2 \frac{\sum_i z_i n_i \exp(-z_i y)}{\sum_i z_i^2 n_i}, \quad (7)$$

where $y=e\psi/(k_B T)$, $\psi$ is the electrostatic potential, $k_B T$ is the thermal energy, and $\kappa$ is the Debye screening parameter.

Applicants' solved Eq. 7 numerically under the following boundary conditions:

$$\frac{dy}{dr} = -\frac{e\sigma}{\varepsilon_> k_B T} \text{ at } r = R, \quad (8)$$

$$y = 0 \text{ at } r = r_b. \quad (9)$$

The boundary conditions were chosen to maintain the electroneutrality within the cylindrical boundary of radius $r_b$. Applicants' employed the Runge-Kutta method with adaptive step size control to solve Eq. (7) with a trial surface potential and obtained the surface potential $\psi(R)$ by means of the bisection method at the outer boundary.

Applicants' now show the numerical results for the effect of linear charge density and salt concentration on the plasmon excitation spectrum of a nanotube at room temperature. First, one calculates the surface potential of a charged nanotube for different linear charge densities for the nanotube concentration equal to 10 μM which we use as a representative concentration. FIG. 1 shows the variation of surface potential with excess salt concentration for a range of linear charge densities. One notes that linear charge density $\xi=0.59$ eÅ$^{-1}$ is the same for a DNA chain in aqueous solution at 298 K. The surface potential at low salt concentration is almost constant, and is close to that of the corresponding salt-free solution. The inventors' results show that the surface potential decreases as excess salt concentration is increased. Moreover, the surface potential increases as the linear charge density is increased. FIG. 1 shows only the magnitude of the surface potential, but the sign may be either positive (attractive to electrons) or negative (repulsive to electrons), depending on the net charge of a nanotube.

Figure 2:
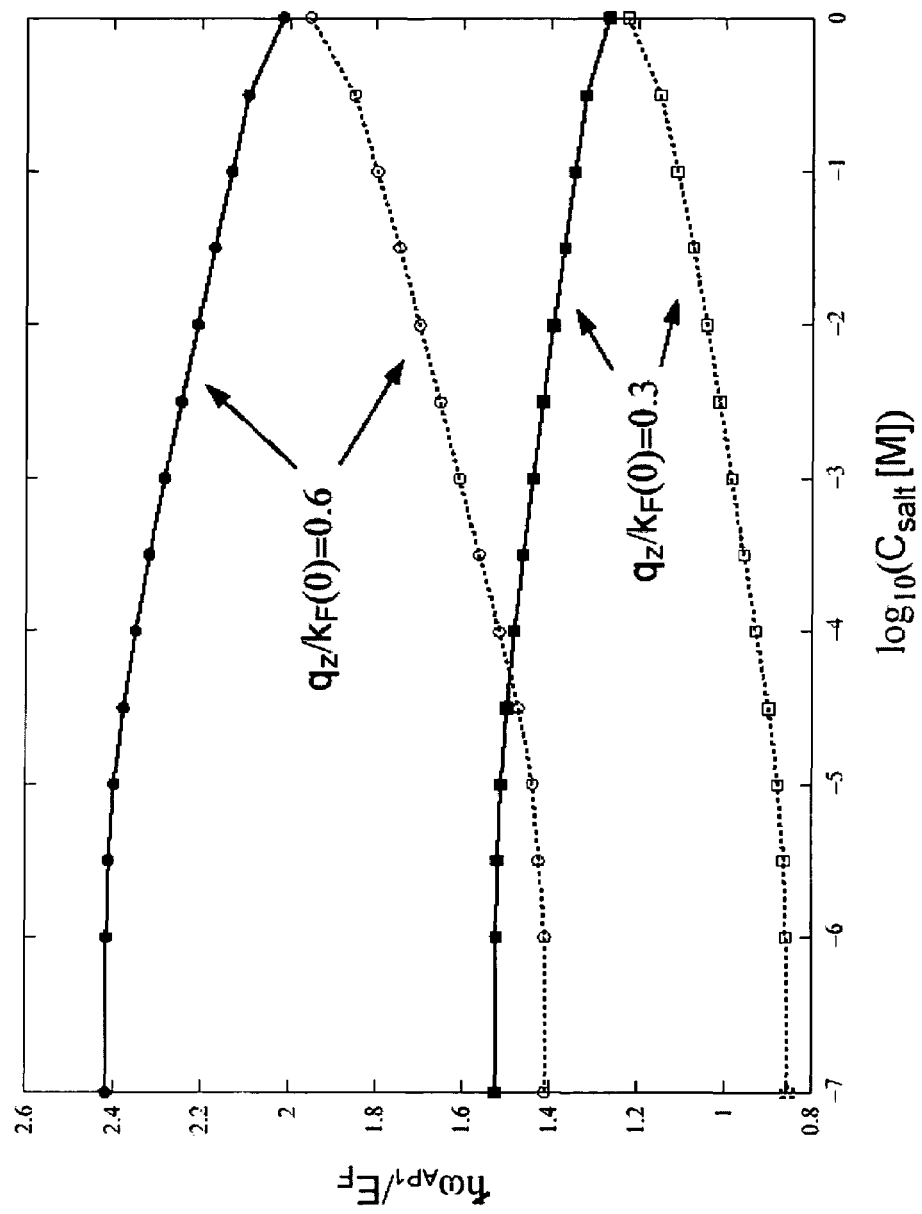
FIG. 2 shows the frequency of the acoustic plasmon AP1 mode (the highest frequency mode) as a function of salt concentration in the presence of an attractive surface potential (solid line) and a repulsive surface potential (dotted line).

At this point in our development, we looked at the effect of excess salt concentration on the plasmon spectrum. This is obtained from the Equation shown below $$1+\alpha_L(q,\omega)=0$$

for various surface potentials. Here, we confine our attention to the collective plasmon mode with the highest frequency $\omega_{AP1}$. In FIG. 2, shows a plot of $\omega_{AP1}$ as a function of salt concentration in the presence of attractive or repulsive surface potential for $q_z/k_F(0)=0.3$ and 0.6. The linear charge density used for the calculations is $\xi=0.59$ eÅ$^{-1}$. For fixed $q_z$, our calculations show that at low salt concentrations, the $\omega_{AP1}$ is almost a constant. As the salt concentration is increased, $\omega_{AP1}$ becomes a monotonically increasing function for repulsive surface potentials and a monotonically decreasing function for attractive surface potentials. In the limit of high salt concentrations, $\omega_{AP1}$ converges to the frequency of a neutral carbon nanotube.

The single wall charged carbon nanotubes of the invention are particularly useful as sensors to detect salt concentrations. Our calculations and results show that the acoustic plasmon AP1 is more sensitive to the change of salt concentration. Applicants' first define the sensitivity of the sensors as follows. One calculates the difference ($\Delta\omega_{AP1}$) between the AP1 frequency of the lowest salt concentration (10$^{-7}$ M) and that of the highest salt concentration (1M) for a given $q_z$. The range of the lowest and highest salt concentration covers typical experimental conditions, between μM to M. For $q_z/kF(0)=0.6$, we have $\hbar\Delta\omega_{AP1}/E_F=0.40$ for positively charged nanotubes, and 0.54 for negatively charged nanotubes. Such a result indicates that a negatively charged nanotube can be more sensitive to the change of ambient salt concentrations.

Figure 3:
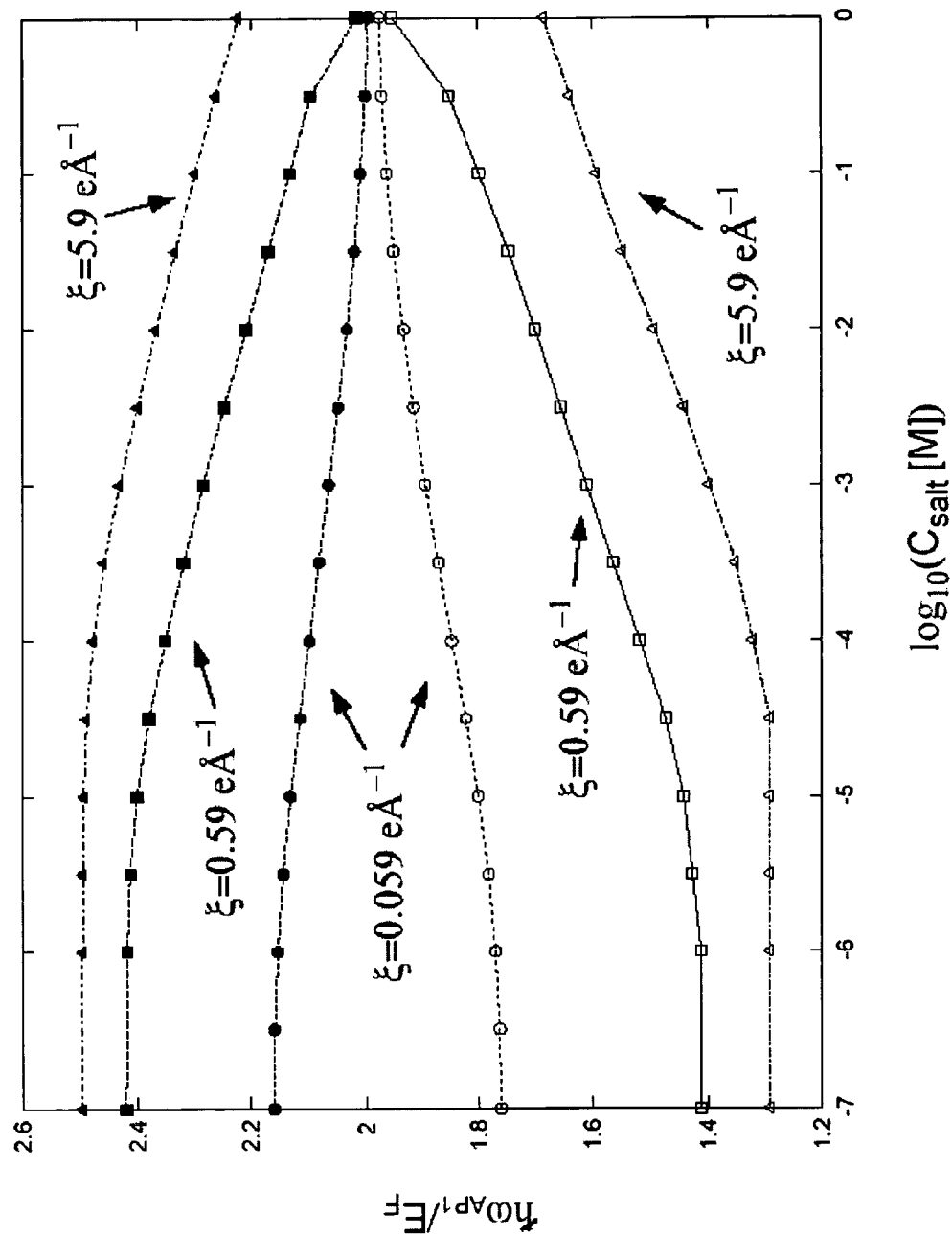
FIG. 3 presents a comparison of the salt-concentration-dependent $\omega_{AP1}$ for three different linear charge densities $\xi=0.059$ e Å$^{-1}$, $\xi=0.59$ e Å$^{-1}$ and $\xi=5.9$ e Å$^{-1}$.

Additional calculations show the effect of linear charge density. FIG. 3 compares the salt-dependent $\omega_{AP1}$ for three different linear charge densities $\xi=0.059$ eÅ$^{-1}$ (Δ), $\xi=0.59$ eÅ$^{-1}$ ( ), and $\xi=5.9$ eÅ$^{-1}$ (o) for $q_z/kF(0)=0.6$, for attractive (solid symbols) and repulsive surface potentials (open symbols); lines are meant for eye guide. Note that $\xi=0.59$ eÅ$^{-1}$ is the linear charge density of DNA. The finding shows that the trend of $\omega_{AP1}$ is the same for all three cases. However, the sensitivity, $\Delta\omega_{AP1}$, is different for different cases. Here a comparison is made for negatively charged nanotubes because they are more sensitive to the change of salt concentration. For $\xi=5.9$ eÅ$^{-1}$, $\hbar\Delta\omega_{AP1}/E_F=0.39$; for $\xi=0.59$ eÅ$^{-1}$, $\Delta\omega_{AP1}/E_F=0.54$; and for $\xi=0.059$ eÅ$^{-1}$, $\Delta\omega_{AP1}/E_F=0.21$. Actually, the charged nanotube of the greatest linear charge density ($\xi=5.9$ eÅ$^{-1}$) is more difficult to be screened out electrostatically.

As a result, such a charged nanotube is less sensitive to the variation of salt concentration. The smallest $\Delta\omega_{AP1}/E_F$ suggests that the charged nanotube of a smaller linear charge density yields a smaller surface potential and is prone to electrostatic screening.

As a result, the negatively charged nanotube with a linear charge density close to that of DNA can be a more sensitive nanoscaled material to detect the salt concentration of ambient solution.

In carbon nanotubes, the optical and electronic properties are strongly correlated due to the presence of the van Hove Singularities in the density of electronic states. The energies of the electronic transitions for many different nanotubes lie within the range of visible light, and therefore it is clear that the electronic properties of semiconducting nanotubes will be greatly affected by emission or absorption of photons with specific energies.

The actual population of allowed levels by electrons within a nanotube is described by the density of states. At the bottom of each subband, the density of states exhibits large spikes termed van Hove singularities. Optical transitions can take place between a van Hove singularity in the valence band and a van Hove singularity in the conduction band. In the case of a transition between the first van Hove singularity in the valence band to the first van Hove singularity in the conduction band, the optical transition is termed a V1 to C1, or sometimes an E11 or sometimes an S11 transition, depending on the author. Both intra-subband and inter-subband transitions produce collective plasma oscillations whose oscillator strength is determined by the density of states and subband structure.

The instant invention provides unique single-wall charged carbon nanotubes for use as optical sensors. The charged single wall carbon nanotubes can react selectively with a target analyte to modulate the optical characteristics of the nanotube. The charged single wall carbon nanotubes are excellent optical sensors with good photo-stability and tunable excitation and emission wavelengths dependent upon the nanotubes geometric structure. The optical excitation and emission in the nanoscale devices of the invention allows for greatly enhanced penetration and negligible auto-emission encountered in thick tissue or unseparated blood samples. Therefore, allowing for highly accurate, real time in vivo sensing.

The present invention further relates to a biosensor responsive to a chemical property in an environment i.e., ion concentration, salt concentration and any other chemical property. The biosensor may have a plurality of charged single-wall carbon nanotubes forming an array and showing a dependence of the chemical property. The biosensor also has a processor coupled to the array of the plurality of charged single-wall carbon nanotubes for processing the response of the plurality of charged single-wall carbon nanotubes to the chemical property.

More in particular, the invention provides sensors comprising single-wall charged carbon nanotubes, which are capable of absorbing and luminescing in the near-infrared portion of the electromagnetic spectrum and provide a sensitive probe for a wide variety of applications. The electronic properties of the nanotube are very sensitive to the molecular environment and provide the capability of sensing adsorbates, chemical bonds, dipolar interactions and other fluid properties by perturbations in the luminescent spectra. Near-IR fluorescence can also be used in detectors or monitors using the single-wall charged carbon nanotubes of the invention.

The single-wall charged carbon nanotubes of the invention are able to absorb electromagnetic radiation and luminesce in the near-IR. It should be noted that luminescence can encompass fluorescence, phosphorescence, photoluminescence, other forms of optical emission, thermoluminescence, electroluminescence and combinations thereof. For the nanotubes of the present invention, the diameter and chirality of the nanotube determine the electronic band-gap and hence the wavelength at which the nanotube will absorb incident photons and exhibit photoluminescence. Because nanotube luminescence is highly dependent on the electronic environment of the nanotube, the single-wall charged carbon nanotubes of the invention are very sensitive probes for monitoring and sensing changed electronic or chemical environment for a wide variety of different applications and uses.

It is also possible that the charged single-wall carbon nanotubes can be derivatized in such a manner, such as on one or both ends with one or more functional groups, such that the nanotube preserves its electronic signature. The functionalized nanotubes, due to the luminescent properties of the semiconducting structure, can be used as indicators in systems where the functional group may congregate, react or be preferentially absorbed.

For purposes of the present invention, it should be noted that the excitation frequencies can range from the near-IR, through the visible (i.e., wavelengths in the range of 400 nm and 700 nm), and, even into the ultraviolet portion of the electromagnetic spectrum (i.e., wavelengths in the range of about 200-400 nm could be used for excitation of some small diameter single-wall charged carbon nanotubes).

Additionally, the sensors of the invention could be implanted into a patient and be activated and read by an optical excitation and detection instrument. The sensors of the invention can be adapted to sense other compounds. The instant invention also provides unique multifunctional tailoring of individual charged carbon nanotubes surfaces with a preservation of electrical and optical properties and therefore, it will have a wide range of new sensor applications.

As a result of Applicants' efforts, single-wall charged carbon nanotubes have also been developed which have many benefits such as: (1) can be used in strongly scattering media, (2) real time biofeedback capabilities, (3) enhanced penetration (centimeters) and negligible auto-fluorescence in thick tissue or blood, (4) multi-channeled sensors are possible in order to detect numerous compounds simultaneously and (5) not susceptible to photobleaching as they exhibit good photostability.

The charged single-wall carbon nanotubes of the invention can be used in many applications but not limited to (1) implantable sensors for real time monitoring of various biological compounds, e.g., glucose, glutamate, etc., (2) implantable therapeutic drug monitoring (TDM) devices for drugs with narrow therapeutic indices or widely variable pharmacokinetic profiles, (3) optical pH sensors, (4) salt or ionic species sensors, (5) implantable sensors for veterinary use, both for livestock (breeding, health management) and companion animal (diabetes care, monitoring of seizure medications) segments, (6) Sensors for point-of-care devices to replace standard laboratory testing in hospitals, nursing homes, and in frontline military medical units, (7) optical sensors for assessing bioterrorism threats, (8) sensors for monitoring environmental pollution, e.g., assessing drinking water quality, (9) sensors for monitoring industrial contamination and (10) sensors for probing cellular systems.

The single-wall charged carbon nanotubes ability to fluoresce in the near-IR optical frequency range provides a highly versatile and fast detection method, enabling new, far-reaching areas of sensing and detecting, even as a minimally invasive, or non-destructive, sensor in biological systems. One of the significant advantages of using excitation radiation and detect emission radiation in the near-IR is that it can be converted to IR images for biological systems as suggested by L. Chiriboga, et al (*Biospectroscopy* 3, 47 (1998)) so that probes, sensors and detectors with nanotubes can be used in biological systems, including cells, tissues, interfacial membranes, and even living organisms.

The spectral properties of the single-wall charged carbon nanotubes, and especially their luminescence properties, are very sensitive to their nanoscale environment. Chemical adsorbates on the nanotubes can alter the spectral properties and, therefore, the charged carbon nanotubes provide a sensitive optical sensing means for adsorbed gases, liquids and solids. The charged carbon nanotubes are responsive to chemically, as well as physically, bound substituents, and can be used to sense general conditions of their environment, such as, but not limited to, pH, temperature, flow, pressure and changes in fluid dynamics and composition. The single-wall charged carbon nanotubes can also receive optical excitation and deliver electronic and thermal energy to their environment, such as by electrical and/or thermal luminescence.

In one embodiment of the invention, single-wall charged carbon nanotubes, that have been individually-dispersed are suspended in a liquid such as water or water containing an ionic species such as NaCl or any other ionic salt inside a vessel such as, a capillary flow tube or mixing chamber in a microfluidics device. The vessel is fitted with a window or structure transparent to light, including that of the near infrared. Then, a light source, such as a conventional source, or a laser, is used to deliver light to the vessel containing the suspended nanotubes via optical fibers and/or other conventional optics. As the light strikes the single-wall charge carbon nanotubes, the nanotubes absorb some of the light, and the single-wall charged carbon nanotubes become luminescent. The transmitted light also contains spectral information about the nanotube environment. After delivering the light, the luminescent light is collected by optical fibers and/or conventional optics, and delivered to a spectrometer for spectral analysis. The various emitted wavelengths are detected and a spectrum is recorded in a computer.

The charged single-wall carbon nanotubes of the invention are generally about 0.5-2 nm in diameter where the ratio of the length dimension to the narrow dimension, i.e., the aspect ratio, is at least 5. In general, the aspect ratio is between 10 and 2000. The charged single-wall carbon nanotubes are comprised primarily of carbon atoms.

Carbon nanotubes (CNT) may be produced by a variety of methods, and are additionally commercially available. Methods of CNT synthesis include laser vaporization of graphite (A. Thess et al. Science 273, 483 (1996)), arc discharge (C. Journet et al., Nature 388, 756 (1997)) and HiPCo (high pressure carbon monoxide) process (P. Nikolaev et al. Chem. Phys. Lett. 313, 91-97 (1999)). Chemical vapor deposition (CVD) can also be used in producing carbon nanotubes (J. Kong et al. Chem. Phys. Lett. 292, 567-574 (1998); J. Kong et al. Nature 395, 878-879 (1998); A. Cassell et al. J. Phys. Chem. 103, 6484-6492 (1999); H. Dai et al. J. Phys. Chem. 103, 11246-11255 (1999)).

Additionally CNT's may be grown via catalytic processes both in solution and on solid substrates (Yan Li, et al., Chem. Mater.; 2001; 13(3); 1008-1014); (N. Franklin and H. Dai Adv. Mater. 12, 890 (2000); A. Cassell et al. J. Am. Chem. Soc. 121, 7975-7976 (1999)).

Most CNT's, as presently prepared, are in the form of entangled tubes. Individual tubes in the product differ in diameter, chirality, and number of walls. Moreover, long tubes show a strong tendency to aggregate into "ropes" held together by Van der Waals forces. These ropes are formed due to the large surface areas of nanotubes and can contain tens to hundreds of nanotubes in one rope.

In a further embodiment of the invention, protonation is used to provide a charge and alter the nanotube's chemical reactivity, electronic and optical properties. The protonation can be performed selectively according to the band-gap energy of the nanotube. The charging and protonation of the different nanotube types can be done by changing the pH of solution of suspended nanotubes and/or exposure of the nanotubes to certain gases, such as $CO_2$. Under acidic conditions, the selective protonation changes the charge on the nanotubes. Protonation also changes other properties of certain diameter nanotubes relative to others, hence creating a differential in properties that can be exploited.

The optical sensors of the invention are designed so that the single-wall carbon nanotubes are charged throughout or on the surface. Their design demonstrates an optical transition within (intra-subband) or between (inter-subband) subbands within the conduction band. This manifests itself as a peak in the absorption spectrum of the nanotube. The present inventors recognized that, by means of their analysis and calculations, changing the subband structure of the nanotube the peak positions in the optical absorption spectrum of the nanotube are changed.

The sensor devices of the invention is also design-based on the selective modulation of the nanotube optical absorption. The Fermi level is the highest energy level which electrons can populate when they occupy the lowest allowed states in any given nanotube at zero degree Kelvin. The Fermi level typically sits somewhere near the center of the bandgap in semiconducting nanotubes. It can be adjusted by the action of electric fields that are very near the nanotube surface. This has the effect of modulating the Fermi level in the nanotube. The phenomenon for this mechanism is called charge transfer doping and the electric field acts through what has been termed the "quantum capacitance" or sometimes the "chemical capacitance". This is another remarkable feature of carbon nanotubes. Electric fields acting very near the surface have a dramatic effect on nanotubes. On the other hand externally generated electric fields have almost no effect on nanotubes up to hundreds of millions of volts per meter.

In order for an optical absorption transition to take place an electron has to be present on the ground or relaxed state in order to take in the energy of the optical photon and be elevated into the higher energy state. If the Fermi level changes, then the strength and the spectral line frequency of the optical absorption will be modified. One such way to create an electric field near the surface of a nanotube is to use free charges in a solution, such as an electrolyte. In this situation the free charge may be driven to the nanotube surface by an external electric field to modify the Fermi level. Another means is to vary the strength of the electrolyte by using electrolytes of differing pH values.

EXAMPLES

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

The following Examples are illustrative of the invention.

Example 1

The single-wall carbon nanotubes of the instant invention are manufactured using high pressure carbon monoxide (HipCO) processes, or pulsed laser vaporization (PLV) processes and/or arc discharge (ARC) processes as further described and illustrated in the references cited above in the description of the preferred embodiments. Each of these processes produce SWCNT structures by depositing free carbon atoms onto a surface at high temperature and/or pressure in the presence of metal catalyst particles.

Example 2

The charged single-wall carbon nanotubes of the invention are designed so an optical transition could take place. In order for an optical absorption transition to take place an electron has to be present on the ground or relaxed state in order to take in the energy of the optical photon and be elevated into the higher energy state. If the Fermi level is altered by an electric field, then the optical absorption spectrum will change. One such way to create an electric field near the surface of a nanotube is to use free charges in a solution, such as an electrolyte. In this situation the free charge may be driven to the nanotube surface by an external electric field to modify the Fermi level. Another means is to vary the strength of the electrolyte by using buffer solutions of various pH values.

Example 3

The charged single-wall carbon nanotubes of the invention are made by taking the nanotubes of Example 1 and dispersing them in a water solution containing an electrolyte such as hydrochloric acid or DNA and sonicating the solution for three hours or longer as required to achieve the desired charged characteristics i.e.; a linear charge density in the range of $\xi=0.059$ e$\text{Å}^{-1}$ to $5.9$ e$\text{Å}^{-1}$. Other methods of charging the nanotubes can be used as long as they achieve linear charge densities in the range described above.

Example 4

This example shows a nanotube-based sensor for pH using charged single-wall carbon nanotubes as described in Example 2. Because of the small size, the nanotube tip sensor could be used as an interfacial sensor. The sensor includes a fiber optic probe that for example irradiates 661-nm light and a surface of single-wall charged carbon nanotubes on the end of the probe. When the probe tip is placed into a solution for pH measurement, the protons from solution interact with the nanotube tip. The excitation light induces fluorescence of the nanotube tip. Depending on the pH, some of the charged sites may be protonated or deprotonated, and the electronic property and spectral property will be changed. The degree that each emit light is a direct function of the solution pH. The light travels up the shaft through a separate fiber optic to a near-IR (infrared) spectrometer that analyzes the collected light. Sensors having specialized properties using type-selected nanotubes could be made in the same way and detect selected pH limits, chemicals or conditions.

Example 5

This example describes the use of charged single-wall carbon nanotubes to detect malignant cells, in vivo and in-vitro or directly inside the body of a mammal. The charged single-wall carbon nanotubes are individually suspended in an aqueous media, such as water. Vigorous shear mixing is applied to the solution to individually suspend at least some of the nanotubes. The suspended nanotubes are then separated from bundled nanotubes and other matter by ultracentrifuging the mixture and decanting the supernatant. The suspending media may include a saline solution, or made compatible by the addition of one or more biocompatibilizing agents, in order for the nanotubes to be introduced into a biological living organism. Such a solution can be administered to a biopsy sample or a body. Once in the biopsy sample or in the body, the nanotubes migrate through the system and attach to target malignant cells. After time has elapsed for sufficient migration and attachment, the body is irradiated with appropriate excitation, preferably excitation that has the ability to penetrate tissue, for the selected nanotube type and simultaneously scanned for emission. The location of the emission is mapped and attributed to the location of the nanotubes attached to the malignant cells. The resulting sensor can be used on living organisms with little insult to the body.

The entire contents including the references cited in all the publications cited herein are incorporated by reference in their entirety for all purposes to the same extent as if each individual publication were so individually denoted.

While there has been described with reference to specific details of certain embodiments thereof of the present invention, it is to be understood that certain changes can be made as would be known to one skilled in the art without departing from the underlying scope of the invention as is discussed and set forth above and below including claims. Furthermore, the embodiments described above and claims set forth below are only intended to illustrate the principles of the present invention and are not intended to limit the scope of the invention to the disclosed elements.

What is being claimed is:

1. An optical sensor comprising a charged single-wall carbon nanotube, wherein the charged single-wall carbon nanotube changes its optical properties at an intensity related to a change in environment and wherein said intensity is derived from a spectral shift and wherein said charged single-wall nanotube has a linear charge density $\xi$ in the range of about $\xi=0.059$ $e\text{Å}^{-1}$ to about $\xi=5.9$ $e\text{Å}^{-1}$.

2. The sensor of claim 1, wherein said linear charge density is close to that of DNA.

3. The sensor of claim 1, wherein said linear charge density is at least $\xi=0.59$ $e\text{Å}^{-1}$.

4. A biosensor responsive to a chemical property in an environment, comprising:
   (a) one or more single charged carbon nanotubes forming an array and showing a dependence of the chemical property, wherein at least one or more of the single-wall carbon nanotubes has a linear charge density $\xi$ in the range of about $\xi=0.059$ $e\text{Å}^{-1}$ to about $\xi=5.9$ $e\text{Å}^{-1}$; and
   (b) a processor coupled to one or more of the single wall charged carbon nanotubes for processing the response of the plurality of single-wall carbon nanotubes to the chemical property.

5. The sensor of claim 4, wherein a presence of the target ligand on the binding site changes an electronic characteristic of the sensor.

6. The sensor of claim 4, wherein the electronic characteristic is an optical response of the sensor.

7. The sensor of claim 4, wherein the electronic characteristic is an electrical response of the sensor.

8. The sensor of claim 4, wherein said linear charge density is close to that of DNA.

9. The sensor of claim 4, wherein said linear charge density is at least $\xi=0.59$ $e\text{Å}^{-1}$.

10. An optical pH sensor comprising at least one charged single-wall carbon nanotube in solution wherein said charged single-wall nanotube has a linear charge density $\xi$ in the range of about $\xi=0.059$ $e\text{Å}^{-1}$ to about $\xi=5.9$ $e\text{Å}^{-1}$.

11. The optical sensor of claim 10, wherein said linear charge density $\xi$ is close to that of DNA.

12. The optical pH sensor of claim 11, wherein said linear charge density is at least $\xi/e=0.59$ $\text{Å}^{-1}$.

13. An optical sensor comprising: (a) a charged single-wall carbon nanotube of finite length having an electrical contact pad at each end thereof; and (b) a plurality of self-assembled molecules on a surface of said carbon nanotube, said molecules serving to modulate electrical conductivity of said carbon nanotube by either a reversible change in dipole moment of said molecules or by a reversible molecule-assisted electron/energy transfer from said molecules onto said carbon nanotube and wherein said charged single-wall nanotube has a linear charge density $\xi$ in the range of about $\xi=0.059$ $e\text{Å}^{-1}$ to about $\xi=5.9$ $e\text{Å}^{-1}$.

14. The optical sensor of claim 13, wherein said linear charge density $\xi$ is close to that of DNA.

15. The optical sensor of claim 13, wherein said linear charge density is at least $\xi=0.59$ $e\text{Å}^{-1}$.

16. A method for measuring an interaction at an interface between a charged single-wall carbon nanotube probe and a target, said method comprising measuring an effect of said interaction between said probe and said target at said interface using a surface-selective linear or nonlinear optical technique and wherein said charged single-wall nanotube has a linear charge density $\xi$ in the range of about $\xi=0.059$ $e\text{Å}^{-1}$ to about $\xi=5.9$ $e\text{Å}^{-1}$.

17. The method of claim 16, wherein said charged single-wall carbon nanotube has a liner charged density $\xi$ that is close to that of DNA.

18. The method of claim 17, wherein said linear charge density is at least $\xi=0.59$ $e\text{Å}^{-1}$.

19. A method for measuring an interaction at an interface between an attached probe consisting of a charged carbon nanotube and a biological component in a cell, said method comprising measuring changes in the ion properties leading to changes in the nonlinear properties of said nanotube, wherein said changes in said nonlinear properties of said nanotube are detected using a surface-selective linear or nonlinear optical technique and wherein said charged single-wall nanotube has a linear charge density $\xi$ in the range of about $\xi=0.059$ $e\text{Å}^{-1}$ to about $\xi=5.9$ $e\text{Å}^{-1}$.

20. The method of claim 19, wherein said charged single-wall carbon nanotube has a liner charged density $\xi$ that is close to that of DNA.

21. The method of claim 20, wherein said linear charge density is at least $\xi=0.59$ $e\text{Å}^{-1}$.

22. The method of claim 19, wherein said changes in the ion properties comprise a ligand-receptor binding.

23. The method of claim 19, wherein said changes in the ion properties leads to a change in the electric potential or charge density of said cell.

24. The method of claim 19, wherein said changes are measured by one or more properties comprising one or more of the following: i) the intensity of the nonlinear or fundamental light, ii) the wavelength or spectrum of the nonlinear or fundamental light, iii) position of incidence of the fundamental light on the surface or substrate, iv) the time-course of i), ii) or iii).

25. A method for optically sensing chemical species, said method comprising:
  (a) illuminating individually-dispersed single-wall charged carbon nanotubes with a electromagnetic radiation capable of causing the nanotubes to emit near-infrared fluorescence;
  (b) monitoring the fluorescence of the single-wall charged carbon nanotubes;
  (c) exposing the single-wall charged carbon nanotubes to chemical species that affect the fluorescence; and
  (d) correlating changes in fluorescence from exposure of the single-wall charged carbon nanotubes to the chemical species and wherein said single-wall charged carbon nanotubes have a linear charge density $\xi$ in the range of about $\xi=0.059$ $e\text{Å}^{-1}$ to about $\xi=5.9$ $e\text{Å}^{-1}$.

26. The optical method of claim 25, wherein said charged single-wall carbon nanotube has a liner charged density $\xi$ that is close to that of DNA.

27. The optical method of claim 26 wherein said linear charge density is at least $\xi/e=0.59$ $\text{Å}^{-1}$.

28. The method of claim 25, wherein the chemical species is in a biological cell.

29. The method of claim 25, wherein the exposing step occurs while performing medical diagnostic testing.

30. The method of claim 25, wherein the electromagnetic radiation is selected from the group consisting of near-infrared, ultraviolet and visible.

31. The method of claim 25, wherein the electromagnetic radiation is generated from a source selected from the group consisting of a laser, a lamp, a light-emitting diode, and combinations thereof.

32. The method of claim 25, wherein the single-wall carbon nanotubes are fashioned into a probe.

33. The method of claim 25, wherein the chemical species is quantified by the changes in fluorescence.

34. A single-wall charged carbon nanotube having a linear charge density $\xi$ in the range of about $\xi=0.059$ $e\text{Å}^{-1}$ to about $\xi=5.9$ $e\text{Å}^{-1}$.

35. The single-wall charged carbon nanotube of claim 34, having a linear charge density close to that of DNA.

36. The single-wall charged carbon nanotube of claim 35, having a linear charge density of at least $\xi=0.59$ $e\text{Å}^{-1}$.

37. An optical sensor for sensing a physical quantity in a chemical or biological environment, said optical sensor comprising: a charged single-wall carbon nanotube material having an optical characteristic which depends on light wavelength; a housing having first and second optical elements for defining a cavity in which the charged single-wall carbon nanotube material is disposed, for transmitting light to the charged single-wall carbon nanotube material, and for transmitting light which has been made incident on the charged single-wall carbon nanotube material; and a controlling element for controlling the charged single-wall carbon nanotube material in accordance with the physical quantity to cause a change to an optical characteristic of the charged single-wall carbon nanotube material which depends on light wavelength and wherein said charged single-wall carbon nanotube has a linear charge density $\xi$ in the range of about $\xi=0.059$ $e\text{Å}^{-1}$ to about $\xi=5.9$ $e\text{Å}^{-1}$.

38. The optical sensor of claim 37 wherein said single-wall charged carbon nanotube has a linear charge density close to that of DNA.

39. The optical sensor of claim 38 wherein said single-wall charged carbon nanotube has a linear charge density of at least $\xi=0.59$ $e\text{Å}^{-1}$.

40. The sensor of claim 37, wherein the optical characteristic is an optical absorption wavelength.

41. The sensor of claim 37, wherein the optical characteristic is a ratio of optical absorption at a first wavelength to a fluorescence at a second wavelength.

42. A detector comprising a charged single-wall carbon nanotubes wherein at least one charged single-wall carbon nanotube emits near-infrared fluorescence and wherein said charged single-wall carbon nanotube has a linear charge density $\xi$ in the range of about $\xi=0.059$ $e\text{Å}^{-1}$ to about $\xi=5.9$ $e\text{Å}^{-1}$.

43. The detector of claim 42 wherein said single-wall charged carbon nanotube has a linear charge density close to that of DNA.

44. The detector of claim 43 wherein said single-wall charged carbon nanotube has a linear charge density of at least $\xi=0.59$ $e\text{Å}^{-1}$.

* * * * *